(12) United States Patent
Wada et al.

(10) Patent No.: US 12,713,525 B2
(45) **Date of Patent: *Aug. 18, 2026**

(54) PRINTED WIRING BOARD

(71) Applicant: IBIDEN CO., LTD., Ogaki (JP)

(72) Inventors: Kentaro Wada, Ogaki (JP); Koji Kondo, Ogaki (JP); Kenji Kunieda, Ogaki (JP); Masashi Umetsu, Ogaki (JP); Yuta Okaga, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 494 days.

This patent is subject to a terminal disclaimer.

(21) Appl. No.: 18/358,248

(22) Filed: Jul. 25, 2023

(65) Prior Publication Data

US 2024/0040692 A1 Feb. 1, 2024

(30) Foreign Application Priority Data

Jul. 26, 2022 (JP) ................................ 2022-118954

(51) Int. Cl.
*H05K 1/02* (2006.01)

(52) U.S. Cl.
CPC ................................ *H05K 1/0296* (2013.01)

(58) Field of Classification Search
CPC .......... H05K 1/0296; H05K 2203/124; H05K 3/389; H05K 3/4644
See application file for complete search history.

(56) References Cited

U.S. PATENT DOCUMENTS

2009/0188706 A1* 7/2009 Endo .................. H01R 43/0256 216/13

FOREIGN PATENT DOCUMENTS

JP 2001-203462 A 7/2001

OTHER PUBLICATIONS

Tamaki et al. JP 506268339 A (Year: 1994).*
Tamaki et al JP H06268339 a Sep. 22, 1994.*

* cited by examiner

*Primary Examiner* — Lawrence D Ferguson
(74) *Attorney, Agent, or Firm* — Finnegan, Henderson, Farabow, Garrett & Dunner, LLP

(57) ABSTRACT

A printed wiring board includes an insulating layer, a conductor layer formed on the insulating layer, an adhesive layer formed on the conductor layer such that the adhesive layer is covering an upper surface and a side surface of the conductor layer, and a resin insulating layer formed on the insulating layer such that the resin insulating layer is covering the conductor layer formed on the insulating layer. The conductor layer is formed such that the upper surface of the conductor layer has an unevenness having a root mean square roughness Rq of 0.23 μm or less.

24 Claims, 3 Drawing Sheets

PRINTED WIRING BOARD

CROSS-REFERENCE TO RELATED APPLICATIONS

The present application is based upon and claims the benefit of priority to Japanese Patent Application No. 2022-118954, filed Jul. 26, 2022, the entire contents of which are incorporated herein by reference.

BACKGROUND OF THE INVENTION

Field of the Invention

A technology disclosed herein relates to a printed wiring board.

Description of Background Art

Japanese Patent Application Laid-Open Publication No. 2001-203462 describes a method for manufacturing a multilayer printed wiring board, the method including sequentially laminating a conductor circuit and an interlayer resin insulating layer on a substrate and forming a layer containing a triazine compound on at least a part of a surface of the conductor circuit. The entire contents of this publication are incorporated herein by reference.

SUMMARY OF THE INVENTION

According to one aspect of the present invention, a printed wiring board includes an insulating layer, a conductor layer formed on the insulating layer, an adhesive layer formed on the conductor layer such that the adhesive layer is covering an upper surface and a side surface of the conductor layer, and a resin insulating layer formed on the insulating layer such that the resin insulating layer is covering the conductor layer formed on the insulating layer. The conductor layer is formed such that the upper surface of the conductor layer has an unevenness having a root mean square roughness Rq of 0.23 μm or less.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
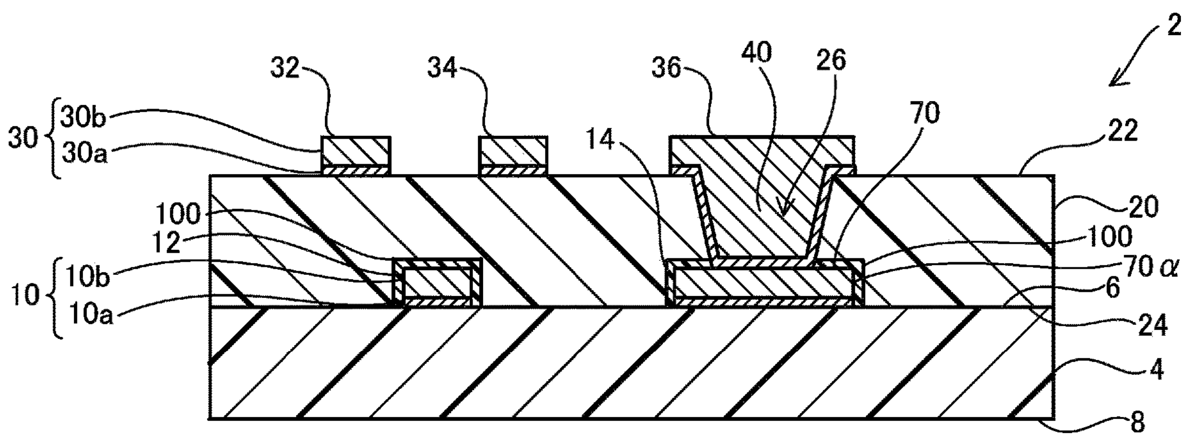
FIG. 1 is a cross-sectional view schematically illustrating a printed wiring board according to an embodiment of the present invention.

Embodiments will now be described with reference to the accompanying drawings, wherein like reference numerals designate corresponding or identical elements throughout the various drawings.

EMBODIMENT

FIG. 1 is a cross-sectional view illustrating a printed wiring board 2 according to an embodiment of the present invention. As illustrated in FIG. 1, the printed wiring board 2 includes an insulating layer 4, a first conductor layer 10, a resin insulating layer 20, a second conductor layer 30, and a via conductor 40. The printed wiring board 2 has an adhesive layer 100 on the first conductor layer 10. The adhesive layer 100 is sandwiched between the first conductor layer 10 and the resin insulating layer 20. The first conductor layer 10 and the second conductor layer 30 are adjacent to each other. There is no conductor layer between the first conductor layer 10 and the second conductor layer 30.

The insulating layer 4 is formed using a thermosetting resin. The insulating layer 4 may be formed of a photocurable resin. The insulating layer 4 may contain inorganic particles such as silica particles. The insulating layer 4 may contain a reinforcing material such as a glass cloth. The insulating layer 4 has a third surface 6 (upper surface in the drawing) and a fourth surface 8 (lower surface in the drawing) on the opposite side with respect to the third surface 6.

The first conductor layer 10 is formed on the third surface 6 of the insulating layer 4. The first conductor layer 10 includes a signal wiring 12 and a pad 14. Although not illustrated in the drawing, the first conductor layer 10 also includes conductor circuits other than the signal wiring 12 and the pad 14. The first conductor layer 10 is mainly formed of copper. The first conductor layer 10 is formed of a seed layer (10*a*) on the insulating layer 4 and an electrolytic plating layer (10*b*) on the seed layer (10*a*). An upper surface and a side surface of the first conductor layer 10 have rough surfaces. For example, the upper surface and the side surface of the conductor layer are roughened. Since sizes of the rough surfaces are small, the upper surface and the side surface of the first conductor layer 10 are substantially smooth. The upper surface of the first conductor layer 10 has a first unevenness 70. The side surface of the first conductor layer 10 has a second unevenness (70*a*). The size of the first unevenness 70 is larger than the size of the second unevenness (70*a*). The size of the first unevenness 70 is expressed using a root mean square roughness (Rq). The root mean square roughness (Rq) of the first unevenness 70 is 0.23 μm or less. The root mean square roughness (Rq) of the first unevenness 70 is preferably 0.1 μm or less.

An upper surface of a conductor circuit forming the first conductor layer 10 is formed of a first surface and a second surface. The first surface is exposed from an opening 26 and is not covered by an adhesive layer 100. The second surface is a portion other than the first surface and is covered by the adhesive layer 100. The side surface of the first conductor layer 10 is covered by the adhesive layer 100. When the opening 26 does not reach the conductor circuit forming the first conductor layer 10, the upper surface of such a conductor circuit is formed only of the second surface. The first surface does not exist. For example, the adhesive layer 100 is formed of an organic material. An example of the organic material is a nitrogen-based organic compound. The nitrogen-based organic compound is, for example, a tetrazole compound. Examples of the nitrogen-based organic compound are disclosed in Japanese Patent Application Laid-Open Publication No. 2015-54987. The adhesive layer 100 does not cover the third surface 6 exposed from the first conductor layer 10. The adhesive layer 100 is sandwiched between the first conductor layer 10 and the resin insulating layer 20. The adhesive layer 100 adheres the first conductor layer 10 and the resin insulating layer 20 together. The resin insulating layer 20 is in contact with the adhesive layer 100.

Figure 2:
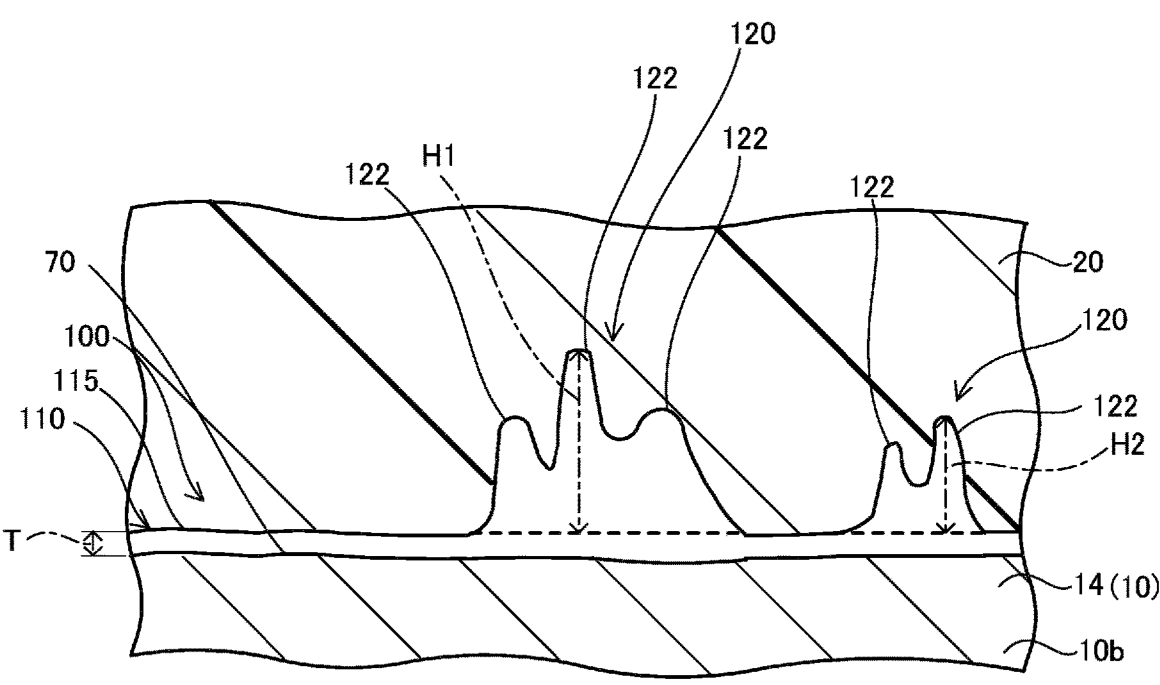
FIG. 2 is an enlarged cross-sectional view schematically illustrating a part of a printed wiring board according to an embodiment of the present invention.

FIG. 2 is an enlarged cross-sectional view illustrating a part of the adhesive layer 100 formed on the second surface. As illustrated in FIG. 2, the adhesive layer 100 is formed of a smooth film 110, which is substantially smooth, and multiple protruding parts 120 protruding from the smooth film 110. The adhesive layer 100 formed on a side surface of the pad 14 is formed of a smooth film 110 and multiple protruding parts 120 similar to the adhesive layer illustrated in FIG. 2, and has a similar shape. The adhesive layer 100 formed on an upper surface and a side surface of the signal wiring 12 is formed of a smooth film 110 and multiple protruding parts 120 similar to that illustrated in FIG. 2, and has a similar shape. The adhesive layer 100 formed on the upper surface and the side surface of the first conductor layer 10 has a shape similar to that illustrated in FIG. 2.

The smooth film 110 has a substantially uniform thickness (T). The thickness (T) of the smooth film 110 is 10 nm or more and 120 nm or less. A ratio (S1/S2) of an area (S1) of the smooth film 110 exposed from the protruding parts 120 to an area (S2) of the adhesive layer 100 is 0.1 or more and 0.5 or less. The smooth film 110 on the upper surface of the first conductor layer 10 is formed substantially along a shape of the upper surface of the first conductor layer 10. The smooth film 110 on the second surface of the first conductor layer 10 is formed substantially along a shape of the second surface of the first conductor layer 10. The smooth film 110 on the side surface of the first conductor layer 10 is formed substantially along a shape of the side surface of the first conductor layer 10. When undulations are formed on the upper surface and the side surface of the first conductor layer 10, the smooth film 110 follows the undulations.

An upper surface of the smoothing film 110 formed on the upper surface of the first conductor layer 10 has a third unevenness 115. The third unevenness 115 has a shape that substantially follows the first unevenness 70. The size of the third unevenness 115 is preferably smaller than the size of the first unevenness 70. For example, a ratio of the size of the third unevenness 115 to the size of the first unevenness 70 ((the size of the third unevenness)/(the size of the first unevenness)) is 0.3 or more and 0.8 or less. Or, the size of the first unevenness 70 is preferably smaller than the size of the third unevenness 115. For example, a ratio of the size of the first unevenness 70 to the size of the third unevenness 115 ((the size of the first unevenness)/(the size of the third unevenness)) is 0.3 or more and 0.8 or less. When the root mean square roughness (Rq) of the first unevenness 70 is 0.10 μm or more and 0.23 μm or less, the size of the third unevenness 115 is smaller than the size of the first unevenness 70. On the other hand, when the root mean square roughness (Rq) of the first unevenness 70 is less than 0.10 the size of the third unevenness 115 is larger than the size of the first unevenness 70.

Each of the protruding parts 120 is formed of multiple protrusions 122. Due to the multiple protrusions 122, unevenness is formed on upper surfaces of the protruding parts 120. The number of the protrusions 122 per 1 $mm^2$ is 5 or more and 15 or less. The protruding parts 120 have heights (H1, H2) between the upper surface of the smooth film 110 and top parts of the protruding parts 120. A maximum value of the heights (H1, H2) is 10 times or more and 30 times or less the thickness (T) of the smooth film 110. The heights (H1, H2) are 200 nm or more and 450 nm or less.

The resin insulating layer 20 is formed on the first conductor layer 10 via the adhesive layer 100. The resin insulating layer 20 is adhered to the first conductor layer 10 by the adhesive layer 100. The rough surfaces formed on the upper surface and the side surface of the first conductor layer 10 contribute to the adhesion between the resin insulating layer 20 and the first conductor layer 10. The resin insulating layer 20 has a first surface 22 (upper surface in the drawing) and a second surface 24 (lower surface in the drawing) on the opposite side with respect to the first surface 22. The second surface 24 of the resin insulating layer 20 faces the first conductor layer 10. The second surface 24 is in contact with the adhesive layer 100. The resin insulating layer 20 has an opening 26 that expose the pad 14. The resin insulating layer 20 is formed of an epoxy resin and inorganic particles dispersed in the epoxy resin. Examples of the resin include a thermosetting resin and a photocurable resin. Examples of the inorganic particles include silica particles and alumina particles. An amount of the inorganic particles in the resin insulating layer 20 is 70 wt % or more.

The first surface 22 of the resin insulating layer 20 has no unevenness. The first surface 22 is not roughened. The first surface 22 is formed smooth. On the other hand, an inner wall surface of the opening 26 has unevenness. A thickness of the resin insulating layer 20 is two or more times a thickness of the second conductor layer 30. The thickness of the resin insulating layer 20 is a distance between the first surface 22 and the upper surface of the first conductor layer 10.

The second conductor layer 30 is formed on the first surface 22 of the resin insulating layer 20. The second conductor layer 30 includes a first signal wiring 32, a second signal wiring 34, and a land 36. Although not illustrated in the drawing, the second conductor layer 30 also includes conductor circuits other than the first signal wiring 32, the second signal wiring 34, and the land 36. The first signal wiring 32 and the second signal wiring 34 form a pair wiring. The second conductor layer 30 is mainly formed of copper. The second conductor layer 30 is formed by a seed layer (30*a*) on the first surface 22 and an electrolytic plating layer (30*b*) on the seed layer (30*a*).

The via conductor 40 is formed in the opening 26. The via conductor 40 connects the first conductor layer 10 and the second conductor layer 30. In FIG. 1, the via conductor connects the pad 14 and the land 36. The via conductor 40 is formed of a seed layer (30*a*) and an electrolytic plating layer (30*b*) on the seed layer (30*a*).

Each side of the printed wiring board 2 illustrated in FIG. 1 has a length of 50 mm or more. The length of each side is preferably 100 mm or more. The length of each side is 250 mm or less.

Method for Manufacturing Printed Wiring Board

Figure 3A:
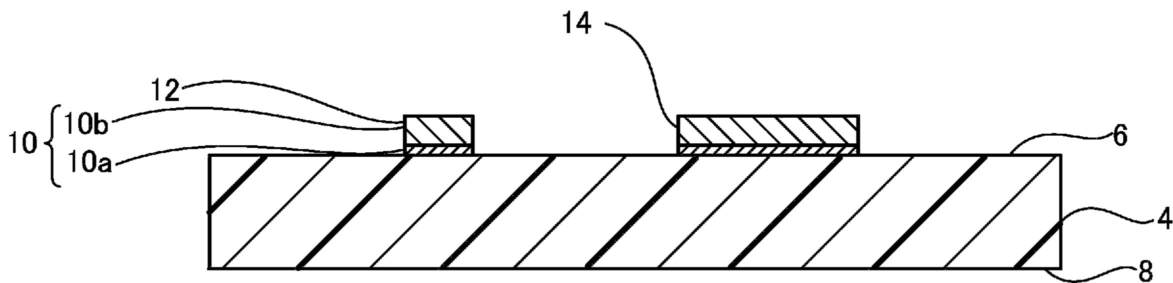
FIG. 3A is a cross-sectional view schematically illustrating a method for manufacturing a printed wiring board according to an embodiment of the present invention.

FIGS. 3A-3E illustrate a method for manufacturing the printed wiring board 2 according to an embodiment of the present invention. FIGS. 3A-3E are cross-sectional views. FIG. 3A illustrates the insulating layer 4 and the first conductor layer 10 formed on the third surface 6 of the insulating layer 4. The first conductor layer 10 is formed using a semi-additive method.

Figure 3B:
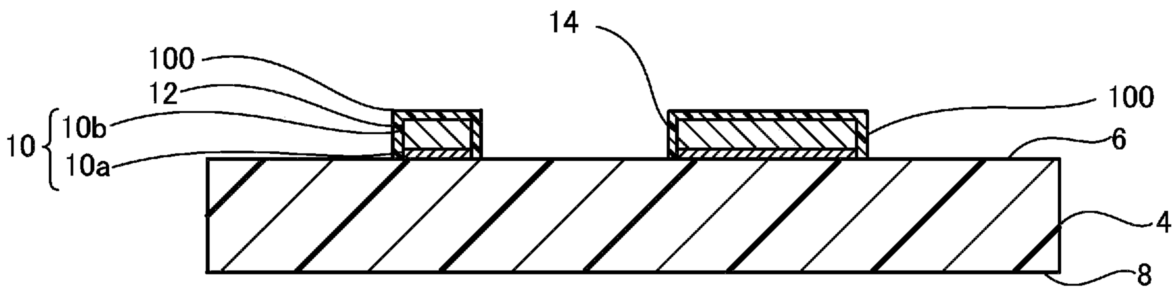
FIG. 3B is a cross-sectional view schematically illustrating a method for manufacturing a printed wiring board according to an embodiment of the present invention.

As illustrated in FIG. 3B, the adhesive layer 100 is formed on the upper surface and the side surface of the first conductor layer 10. For example, the adhesive layer 100 is formed by immersing the intermediate substrate illustrated in FIG. 3A in a chemical solution containing a nitrogen-based organic compound. The chemical solution has a pH or 7 or less. By immersing the intermediate substrate in the chemical solution, the adhesive layer 100 including the smoothing film 110 and the protruding parts 120 (FIG. 2) is formed on the upper surface and the side surface of the first conductor layer 10. Before the intermediate substrate is immersed in the chemical solution, an oxide film on the upper surface and the side surface of the first conductor layer 10 is removed. In a modified embodiment the adhesive layer 100 is formed by applying a chemical solution on the first conductor layer 10. When the adhesive layer 100 is formed, the intermediate substrate is taken out from the chemical solution. The adhesive layer 100 is dried. The upper surface of the adhesive layer 100 before drying may be smooth. In this case, by the drying, a part of the adhesive layer aggregates. By the aggregating, the adhesive layer 100 including the smooth film 110 and the protruding parts 120 is formed.

Figure 3C:
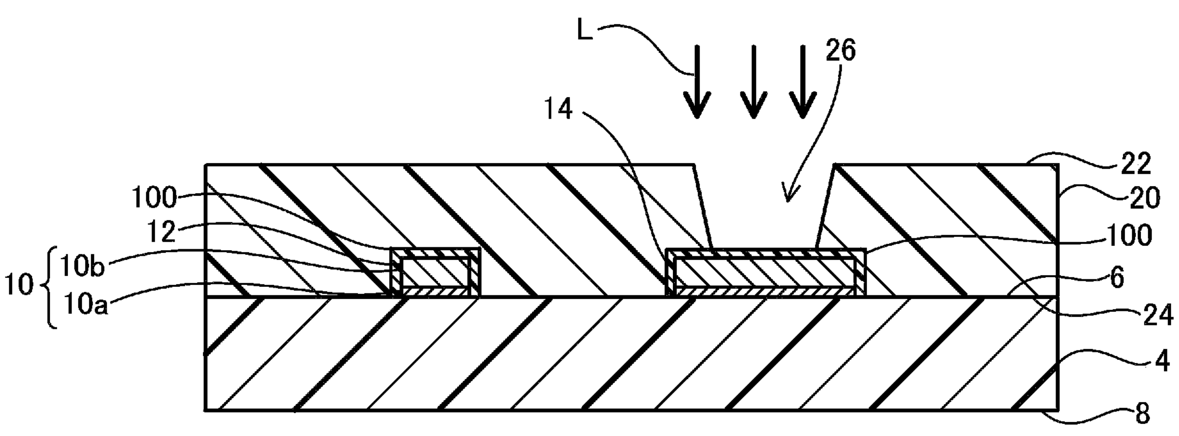
FIG. 3C is a cross-sectional view schematically illustrating a method for manufacturing a printed wiring board according to an embodiment of the present invention.

The resin insulating layer 20 is formed on the first conductor layer 10 which is covered by the adhesive layer 100. The second surface 24 of the resin insulating layer 20 faces the third surface 6 of the insulating layer 4. The second surface 24 is in contact with the adhesive layer 100. As illustrated in FIG. 3C, laser (L) is irradiated from above the resin insulating layer 20. The laser (L) penetrates the resin insulating layer 20. The laser (L) penetrates the adhesive layer 100 covering the pad 14 and reaches the pad 14. Or, the adhesive layer 100 is not completely removed by the laser (L). A bottom of the opening 26 is formed by the adhesive layer 100. The opening 26 for a via conductor reaching the pad 14 is formed. Or, the opening 26 for a via conductor reaching the adhesive layer 100 is formed. The adhesive layer 100 covering the pad 14 is exposed by the opening 26. The laser (L) is, for example, UV laser or CO 2 laser. In the example of FIG. 3C, a bottom of the opening 26 is formed by the adhesive layer 100.

Figure 3D:
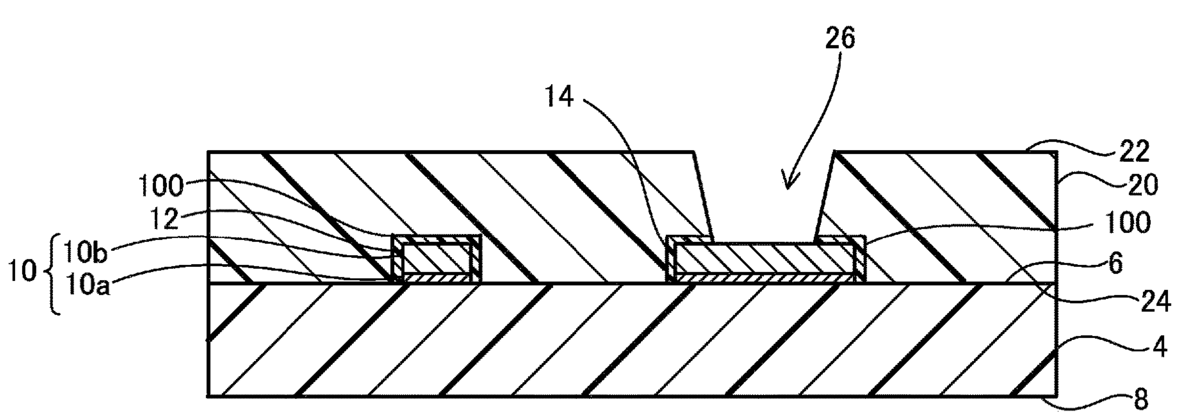
FIG. 3D is a cross-sectional view schematically illustrating a method for manufacturing a printed wiring board according to an embodiment of the present invention.

As illustrated in FIG. 3D, the inside of the opening 26 is cleaned. When the adhesive layer 100 is not completely removed by the laser (L), the adhesive layer 100 exposed from the opening 26 is removed by cleaning the inside of the opening 26. The pad 14 is exposed from the opening 26. Resin residues generated when the opening 26 is formed are removed. The cleaning of the inside of the opening 26 is performed using plasma. That is, the cleaning is performed in a dry process. The cleaning may be performed using a chemical solution containing an oxidizing agent. An example of the oxidizing agent is potassium permanganate. The cleaning includes a desmear treatment. The adhesive layer 100 formed between the second surface 24 of the resin insulating layer and the pad 14 is not removed. Therefore, no gap is formed between the second surface 24 of the resin insulating layer 20 and the pad 14.

Figure 3E:
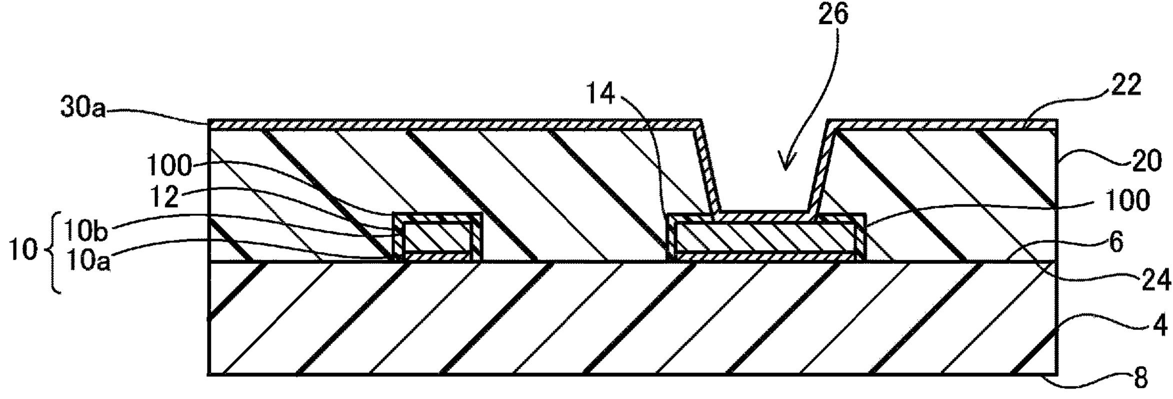
FIG. 3E is a cross-sectional view schematically illustrating a method for manufacturing a printed wiring board according to an embodiment of the present invention.

As illustrated in FIG. 3E, the seed layer (30*a*) is formed on the first surface 22 of the resin insulating layer 20. The seed layer (30*a*) is formed by electroless plating. It is also possible that the seed layer (30*a*) is formed by sputtering.

A plating resist is formed on the seed layer (30*a*). The plating resist has openings for forming the first signal wiring 32, the second signal wiring 34, and the land 36 (FIG. 1).

The electrolytic plating layer (30*b*) is formed on the seed layer (30*a*) exposed from the plating resist. The electrolytic plating layer (30*b*) is formed of copper. The electrolytic plating layer (30*b*) fills the opening 26. The first signal wiring 32, the second signal wiring 34, and the land 36 are formed by the seed layer (30*a*) and the electrolytic plating film (30*b*) on the first surface 22. The second conductor layer 30 is formed. The via conductor 40 is formed by the seed layer (30*a*) and the electrolytic plating film (30*b*) in the opening 26. The via conductor 40 connects the pad 14 and the land 36. The first signal wiring 32 and the second signal wiring 34 form a pair wiring.

The plating resist is removed. The seed layer (30*a*) exposed from the electrolytic plating layer (30*b*) is removed. The second conductor layer 30 and the via conductor 40 are formed at the same time. The printed wiring board 2 (FIG. 1) of the embodiment is obtained.

The printed wiring board 2 of the embodiment (FIGS. 1 and 2) has the first unevenness 70 on the upper surface of the first conductor layer 10. A second unevenness (70*a*) is formed on the side of the first conductor layer 10. Further, the first unevenness 70 is covered by the adhesive layer 100. The second unevenness (70*a*) is covered by the adhesive layer 100. The first conductor layer 10 and the resin insulating layer 20 are adhered to each other via the adhesive layer 100. The first unevenness 70 and the second unevenness (70*a*) contribute to the adhesion between the first conductor layer 10 and the resin insulating layer 20. Therefore, the adhesion between the first conductor layer 10 and the resin insulating layer 20 is increased. Even when the number of conductor layers in a buildup layer is 5 or more, the resin insulating layer 20 is unlikely to peel off from the first conductor layer 10. Even when the length of each side of the printed wiring board 2 exceeds 50 mm, the resin insulating layer 20 is unlikely to peel off from the first conductor layer 10. Even when the number of via conductors forming a stacked via is 5 or more, a change in resistance caused by peeling is suppressed. Further, the root mean square roughness (Rq) of the first unevenness 70 and the second unevenness (70*a*) is 0.23 μm or less. Therefore, when data is transmitted via the conductor circuit included in the first conductor layer 10, the transmission loss is small. When a high-speed signal is transmitted, noise is unlikely to occur. The printed wiring board 2 of the embodiment can transmit high-speed signals with low loss and suppresses peeling between the conductor layer and the resin insulating layer. A high quality printed wiring board 2 is provided.

First Alternative Example of Embodiment

A printed wiring board 2 of a first alternative example of the embodiment includes multiple conductor layers, multiple interlayer resin insulating layers, and multiple via conductors. The conductor layers and the interlayer resin insulating layers are alternately laminated. Adjacent conductor layers are connected by the via conductors. In the first alternative example, the number of the conductor layers is 5 or more and 20 or less. The interlayer resin insulating layers have substantially equal thicknesses. The conductor layers and the interlayer resin insulating layers are adhered to each other with adhesive layers 100. In the embodiment and the first alternative example, the adhesive layers 100 have the same structure and shape. Similar to the embodiment, each of the adhesive layers 100 is formed on an upper surface and a side surface of a conductor layer. Each of the adhesive layers 100 is sandwiched between a conductor layer and in interlayer resin insulating layer. Even when the number of the conductor layers is 5 or more, the interlayer resin insulating layers are unlikely to peel off from the conductor layers. Since the number of the conductor layers is 20 or less, a crack caused by the adhesive layers 100 is unlikely to occur in the interlayer resin insulating layers. The number of the conductor layers is preferably 10 or more. The number of the conductor layers is more preferably 15 or more. The adhesive layers 100 effectively function.

The printed wiring board 2 of FIG. 1 includes two conductor layers (the first conductor layer 10 and the second conductor layer 30). There is one first conductor layer 10. There is one second conductor layer 30. The first conductor layer 10 and the second conductor layer 30 are included in the conductor layers of the first alternative example. The resin insulating layer 20 of FIG. 1 is included in the interlayer resin insulating layers of the first alternative example. In the first alternative example, the conductor layers other than the first conductor layer 10 and the second conductor layer 30 are third conductor layers. In the first alternative example, one of the multiple interlayer resin insulating layers is formed directly on the resin insulating layer 20 and the second conductor layer 30. The interlayer resin insulating layer formed directly on the resin insulating layer 20 and the second conductor layer 30 is a first interlayer resin insulating layer. In the first alternative example, an adhesive layer 100 is formed between the first interlayer resin insulating layer and the second conductor layer 30. Or, no adhesive layer 100 is formed between the first interlayer resin insulating layer and the second conductor layer 30. The conductor layers of first alternative example and the first conductor layer 10 of the embodiment are the same. The two have the same root mean square roughness (Rq).

Second Alternative Example of Embodiment

In a second alternative example, a conductor layer is formed below the insulating layer 4 of the printed wiring board 2 of FIG. 1. And, the insulating layer 4 is formed by the resin insulating layer 20 of FIG. 1. The conductor layer and the first conductor layer 10 are connected by a via conductor penetrating the resin insulating layer sandwiched between the conductor layer and the first conductor layer 10. Except for forming the conductor layer below the insulating layer 4, forming the insulating layer 4 with the resin insulating layer 20, and forming the via conductor in the resin insulating layer sandwiched between the conductor layer and the first conductor layer 10, the embodiment and the second alternative example are the same. The conductor layers of second alternative example and the first conductor layer 10 of the embodiment are the same. The two have the same root mean square roughness (Rq).

Japanese Patent Application Laid-Open Publication No. 2001-203462 describes a method for manufacturing a multilayer printed wiring board, the method including sequentially laminating a conductor circuit and an interlayer resin insulating layer on a substrate and forming a layer containing a triazine compound on at least a part of a surface of the conductor circuit. The conductor circuit and the interlayer resin insulating layer are adhered to each other via a layer containing a triazine compound.

In the printed wiring board manufactured using the technology of Japanese Patent Application Laid-Open Publication No. 2001-203462, it is thought that the upper surface and the side surface of the conductor circuit are not roughened for high-speed signal transmission. Therefore, when a large stress is applied between the conductor circuit and the interlayer resin insulating layer, peeling is expected to occur between the conductor circuit and the interlayer resin insulating layer. When the number of conductor layers in a build-up layer is 5 or more, peeling is expected to occur between the conductor circuit and the interlayer resin insulating layer. When a length of each side of the printed wiring board exceeds 50 mm, peeling is expected to occur between the conductor circuit and the interlayer resin insulating layer.

A printed wiring board according to an embodiment of the present invention includes an insulating layer, a conductor layer formed on the insulating layer, an adhesive layer formed on the conductor layer, and a resin insulating layer formed on the insulating layer and the conductor layer. The adhesive layer covers an upper surface and a side surface of the conductor layer. The upper surface of the conductor layer has a first unevenness, the side surface of the conductor layer has a second unevenness, and a root mean square roughness (Rq) of the first unevenness is 0.23 μm or less.

In the printed wiring board of an embodiment of the present invention, the upper surface and the side surface of the conductor layer have rough surfaces. For example, the upper surface and the side surface of the conductor layer are roughened. The conductor layer has the first unevenness and the second unevenness. Further, the rough surfaces are covered by the adhesive layer. The first unevenness and the second unevenness are covered by the adhesive layer. The rough surfaces and the adhesive layer covering the rough surfaces contribute to the adhesion between the conductor layer and the resin insulating layer. Therefore, the adhesion between the conductor layer and the resin insulating layer is increased. Even when the number of conductor layers in a buildup layer is 5 or more, the resin insulating layer is unlikely to peel off from the conductor layer. Even when a length of each side of a printed wiring board exceeds 50 mm, the resin insulating layer is unlikely to peel off from the conductor layer. Since peeling is unlikely to occur, resistance of the conductor layer is stable. Further, since the root mean square roughness (Rq) of the first unevenness is 0.23 μm or less, data transmission loss can be reduced. When high-speed signals are transmitted, noise in the signals is unlikely to occur. The printed wiring board according to an embodiment of the present invention can transmit high-speed signals and suppress peeling between a conductor layer and a resin insulating layer. A high-quality printed wiring board is provided.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:

an insulating layer;

a conductor layer formed on the insulating layer;

an adhesive layer formed on the conductor layer such that the adhesive layer is covering an upper surface and a side surface of the conductor layer; and a resin insulating layer formed on the insulating layer such that the resin insulating layer is covering the conductor layer formed on the insulating layer, wherein the conductor layer is formed such that the upper surface of the conductor layer has an unevenness having a root mean square roughness Rq of 0.23 μm or less, and the adhesive layer is formed such that the adhesive layer has an upper surface having an unevenness and that the unevenness of the upper surface of the adhesive layer has a shape following the unevenness of the upper surface of the conductor layer.

2. The printed wiring board according to claim 1, wherein the conductor layer is formed such that the root mean square roughness Rq of the unevenness is 0.1 μm or less.

3. A printed wiring board according to claim 1, comprising:

an insulating layer;

a conductor layer formed on the insulating layer;

an adhesive layer formed on the conductor layer such that the adhesive layer is covering an upper surface and a side surface of the conductor layer; and a resin insulating layer formed on the insulating layer such that the resin insulating layer is covering the conductor layer formed on the insulating layer, wherein the conductor layer is formed such that the upper surface of the conductor layer has an unevenness having a root mean square roughness Rq of 0.23 μm or less, and the adhesive layer is formed such that the adhesive layer has an upper surface having an unevenness and that the unevenness of the upper surface of the adhesive layer has a size that is smaller than a size of the unevenness of the upper surface of the conductor layer.

4. The printed wiring board according to claim 2, wherein the adhesive layer is formed such that the unevenness of the upper surface of the adhesive layer has a size that is larger than a size of the unevenness of the upper surface of the conductor layer.

5. A printed wiring board, comprising:

an insulating layer;

a conductor layer formed on the insulating layer;

an adhesive layer formed on the conductor layer such that the adhesive layer is covering an upper surface and a side surface of the conductor layer; and a resin insulating layer formed on the insulating layer such that the resin insulating layer is covering the conductor layer formed on the insulating layer, wherein the conductor layer is formed such that the upper surface of the conductor layer has an unevenness having a root mean square roughness Rq of 0.23 μm or less, and the adhesive layer has a smooth film portion having a uniform thickness and protruding part protruding from the smooth film portion.

6. The printed wiring board according to claim 5, wherein the adhesive film is formed such that the protruding part has a maximum height in a range of 10 to 30 times a thickness of the smooth film portion where a height is measured between an upper surface of the smooth film portion and a top part of the protruding part.

7. The printed wiring board according to claim 5, wherein the adhesive film is formed such that the smooth film portion has a thickness in a range of 10 nm to 120 nm and that the protruding part has a height in a range of 200 nm to 450 nm between an upper surface of the smooth film portion and a top part of the protruding part.

8. The printed wiring board according to claim 5, wherein the adhesive film is formed such that a ratio of an area of the smooth film portion exposed from the protruding part to an area of the adhesive layer is in a range of 0.1 to 0.5.

9. A printed wiring board, comprising:

an insulating layer;

a conductor layer formed on the insulating layer;

an adhesive layer formed on the conductor layer such that the adhesive layer is covering an upper surface and a side surface of the conductor layer; and a resin insulating layer formed on the insulating layer such that the resin insulating layer is covering the conductor layer formed on the insulating layer, wherein the conductor layer is formed such that the upper surface of the conductor layer has an unevenness having a root mean square roughness Rq of 0.23 μm or less, and the adhesive film is formed such that the adhesive layer is not covering part of the insulating layer exposed from the conductor layer.

10. The printed wiring board according to claim 5, wherein the adhesive film is formed such that the smooth film portion on the upper surface of the conductor layer is formed substantially along a shape of the upper surface of the conductor layer.

11. A printed wiring board, comprising:

an insulating layer;

a conductor layer formed on the insulating layer;

an adhesive layer formed on the conductor layer such that the adhesive layer is covering an upper surface and a side surface of the conductor layer; and a resin insulating layer formed on the insulating layer such that the resin insulating layer is covering the conductor layer formed on the insulating layer, wherein the conductor layer is formed such that the upper surface of the conductor layer has an unevenness having a root mean square roughness Rq of 0.23 μm or less, and the adhesive layer comprises an organic material.

12. The printed wiring board according to claim 5, wherein the adhesive film is formed such that the protruding part has a plurality of protrusions and that the plurality of protrusions is forming unevenness on an upper surface of the protruding part.

13. The printed wiring board according to claim 5, wherein the adhesive film is formed such that the protruding part has a plurality of protrusions and that a number of the protrusions per 1 $mm^2$ is in a range of 5 to 15.

14. The printed wiring board according to claim 2, wherein the adhesive layer has a smooth film portion having a uniform thickness and protruding part protruding from the smooth film portion.

15. The printed wiring board according to claim 14, wherein the adhesive film is formed such that the protruding part has a maximum height in a range of 10 to 30 times a thickness of the smooth film portion where a height is measured between an upper surface of the smooth film portion and a top part of the protruding part.

16. The printed wiring board according to claim 14, wherein the adhesive film is formed such that the smooth film portion has a thickness in a range of 10 nm to 120 nm and that the protruding part has a height in a range of 200 nm to 450 nm between an upper surface of the smooth film portion and a top part of the protruding part.

17. The printed wiring board according to claim 14, wherein the adhesive film is formed such that a ratio of an area of the smooth film portion exposed from the protruding part to an area of the adhesive layer is in a range of 0.1 to 0.5.

18. The printed wiring board according to claim 2, wherein the adhesive layer comprises an organic material.

19. The printed wiring board according to claim 14, wherein the adhesive film is formed such that the protruding part has a plurality of protrusions and that a number of the protrusions per 1 $mm^2$ is in a range of 5 to 15.

20. The printed wiring board according to claim 9, wherein the conductor layer is formed such that the root mean square roughness Rq of the first unevenness is 0.1 μm or less.

21. The printed wiring board according to claim 9, wherein the adhesive layer is formed such that the adhesive layer has an upper surface having an unevenness and that the unevenness of the upper surface of the adhesive layer has a shape following the unevenness of the upper surface of the conductor layer.

22. The printed wiring board according to claim 9, wherein the adhesive layer is formed such that the adhesive layer has an upper surface having an unevenness and that the unevenness of the upper surface of the adhesive layer has a size that is smaller than a size of the unevenness of the upper surface of the conductor layer.

23. The printed wiring board according to claim 9, wherein the adhesive layer has a smooth film portion having a uniform thickness and protruding part protruding from the smooth film portion.

24. The printed wiring board according to claim 9, wherein the adhesive layer comprises an organic material.

* * * * *